United States Patent
Chi et al.

(10) Patent No.: US 9,589,847 B1
(45) Date of Patent: Mar. 7, 2017

(54) METAL LAYER TIP TO TIP SHORT

(71) Applicants: International Business Machines Corporation, Armonk, NY (US); GlobalFoundries, Inc., Grand Cayman (KY)

(72) Inventors: Cheng Chi, Jersey City, NJ (US); Ruilong Xie, Schenectady, NY (US)

(73) Assignees: INTERNATIONAL BUSINESS MACHINES CORPORATION, Armonk, NY (US); GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/046,916

(22) Filed: Feb. 18, 2016

(51) Int. Cl.
| | | |
|---|---|---|
| H01L 27/088 | (2006.01) | |
| H01L 21/8234 | (2006.01) | |
| H01L 21/768 | (2006.01) | |
| H01L 29/06 | (2006.01) | |
| H01L 23/535 | (2006.01) | |
| H01L 27/02 | (2006.01) | |

(52) U.S. Cl.
CPC .. *H01L 21/823475* (2013.01); *H01L 21/7685* (2013.01); *H01L 21/76802* (2013.01); *H01L 21/76877* (2013.01); *H01L 23/535* (2013.01); *H01L 27/0207* (2013.01); *H01L 29/0649* (2013.01)

(58) Field of Classification Search
CPC ......... H01L 2924/0002; H01L 2924/00; H01L 21/743; H01L 21/823475; H01L 21/823481; H01L 23/5226; H01L 23/528; H01L 27/0207; H01L 27/11; H01L 27/1104; H01L 27/1116; H01L 29/0649; H01L 21/76802; H01L 21/7685; H01L 21/76877
USPC ............... 257/401, 506, 773, 330, 139, 756; 438/654, 253, 626, 287
See application file for complete search history.

(56) References Cited

U.S. PATENT DOCUMENTS

| | | | | |
|---|---|---|---|---|
| 5,480,837 | A * | 1/1996 | Liaw | ................... H01L 21/7684 257/E21.583 |
| 7,517,754 | B2 * | 4/2009 | McDaniel | ......... H01L 27/10852 257/E21.646 |
| 7,701,058 | B2 * | 4/2010 | Anderson | ......... H01L 21/28052 257/754 |
| 7,800,106 | B2 | 9/2010 | Feustel et al. | |
| 8,531,033 | B2 | 9/2013 | Koike et al. | |

(Continued)

*Primary Examiner* — Mohammed Shamsuzzaman
(74) *Attorney, Agent, or Firm* — Cantor Colburn LLP; Vazken Alexanian

(57) ABSTRACT

Techniques relate to forming an integrated circuit. Trench contacts are formed on top of at least one source and drain of an intermediate structure. An interlayer dielectric is formed on top of the intermediate structure. A trench is cut through the interlayer dielectric, through at least one of the trench contacts, down to a shallow trench isolation area. The trench is filled with a filling material. Upper contacts are formed on top of the trench contacts in the interlayer dielectric. A first metal layer pattern is patterned such that a separation is formed by a filling material width of the filling material. First metal layers are formed according to the first metal layer pattern, where tips of the first metal layers are aligned to the filling material that fills the trench, such that the tips of the first metal layers are separated by the filling material width.

13 Claims, 16 Drawing Sheets

(56) References Cited

U.S. PATENT DOCUMENTS

| | | | | |
|---|---|---|---|---|
| 8,691,690 B2* | 4/2014 | Amoah | ............ | H01L 21/31144 |
| | | | | 257/E21.585 |
| 8,716,773 B2* | 5/2014 | Taniguchi | ......... | H01L 27/10814 |
| | | | | 257/296 |
| 8,741,718 B2* | 6/2014 | Sardesai | ......... | H01L 21/823425 |
| | | | | 257/368 |
| 9,064,801 B1 | 6/2015 | Horak et al. | | |
| 9,406,511 B2* | 8/2016 | Huang | ................ | H01L 21/0332 |
| 2008/0121999 A1* | 5/2008 | Kawahara | ......... | H01L 21/82345 |
| | | | | 257/366 |
| 2012/0037954 A1* | 2/2012 | Hshieh | ............... | H01L 29/0638 |
| | | | | 257/139 |
| 2012/0037980 A1* | 2/2012 | Peake | .................. | H01L 29/407 |
| | | | | 257/330 |
| 2014/0312500 A1* | 10/2014 | Zhu | ...................... | G03F 7/7045 |
| | | | | 257/773 |
| 2015/0008513 A1* | 1/2015 | Lin | .................... | H01L 29/4236 |
| | | | | 257/330 |
| 2015/0097263 A1* | 4/2015 | Kim | .................... | H01L 21/743 |
| | | | | 257/506 |

\* cited by examiner

METAL LAYER TIP TO TIP SHORT

BACKGROUND

The present invention relates generally to integrated circuits, and more specifically, to improved metal layer tip-to-tip short.

The back end of line (BEOL) is the second portion of integrated circuit fabrication where the individual devices (transistors, capacitors, resistors, etc.) get interconnected with wiring on the wafer, i.e., the metallization layer. Common metals are copper interconnect and aluminum interconnect. BEOL generally begins when the first layer of metal is deposited on the wafer. BEOL includes contacts, insulating layers (dielectrics), metal levels, and bonding sites for chip-to-package connections.

General steps of BEOL may include (silicidation of source/drain region usually considered as front end of line (FEOL) or middle of line (MOL). BEOL usually starts from material when copper (Cu) is used):

1. Silicidation of source and drain regions and the polysilicon region.
2. Adding a dielectric (first, lower layer is pre-metal dielectric (PMD) to isolate metal from silicon and polysilicon), and then chemical mechanical polishing/planarization processing it.
3. Make holes in PMD in order to make contacts in them.
4. Add metal layer 1.
5. Add a second dielectric (i.e., the intra-metal dielectric).
6. Make vias through dielectric to connect lower metal with higher metal, where the vias are filled by metal and steps 4-6 are repeated to form all metal layers.
7. Add final passivation layer to protect the microchip.

SUMMARY

According to an embodiment, a method of forming an integrated circuit is provided. The method includes forming trench contacts on top of at least one source and drain of an intermediate structure, forming an interlayer dielectric on top of the intermediate structure, and forming a trench cut through the interlayer dielectric, through at least one of the trench contacts, down to a shallow trench isolation area. Also, the method includes filling the trench with a filling material, forming upper contacts on top of the trench contacts in the interlayer dielectric, and patterning a first metal layer pattern such that a separation is formed by a filling material width of the filling material. Further, the method includes forming first metal layers according to the first metal layer pattern, where tips of the first metal layers are aligned to the filling material that fills the trench, such that the tips of the first metal layers are separated by the filling material width.

According to an embodiment, an integrated circuit is provided. The circuit includes trench contacts on top of at least one source and drain, a filling material formed through an interlayer dielectric, through at least one of the trench contacts, down to a shallow trench isolation area. Also, the circuit includes upper contacts on top of the trench contacts in the interlayer dielectric, and first metal layers formed in a first metal layer pattern such that the first metal layers are separated by a filling material width of the filling material, where tips of the first metal layers are aligned to the filling material, such that the tips of the first metal layers are separated by the filling material width.

DETAILED DESCRIPTION

Metal layer (M0) tip-to-tip processing may be recognized as challenging. Particularly, when considering the use of optical lithography (which requires multiple colors during very-large-scale-integration (VLSI) layout), it is even harder to meet both requirements for the tip-to-tip space and sufficient extension for metal layer (V0) landing. Recently, it is also found that trench silicide (TS) patterning using a big rectangular shape is more robust than using individual line shapes.

Embodiments disclose a novel trench silicide (TS) cut (late) process which improves the M0 tip-to-tip issue.

Figure 1A:
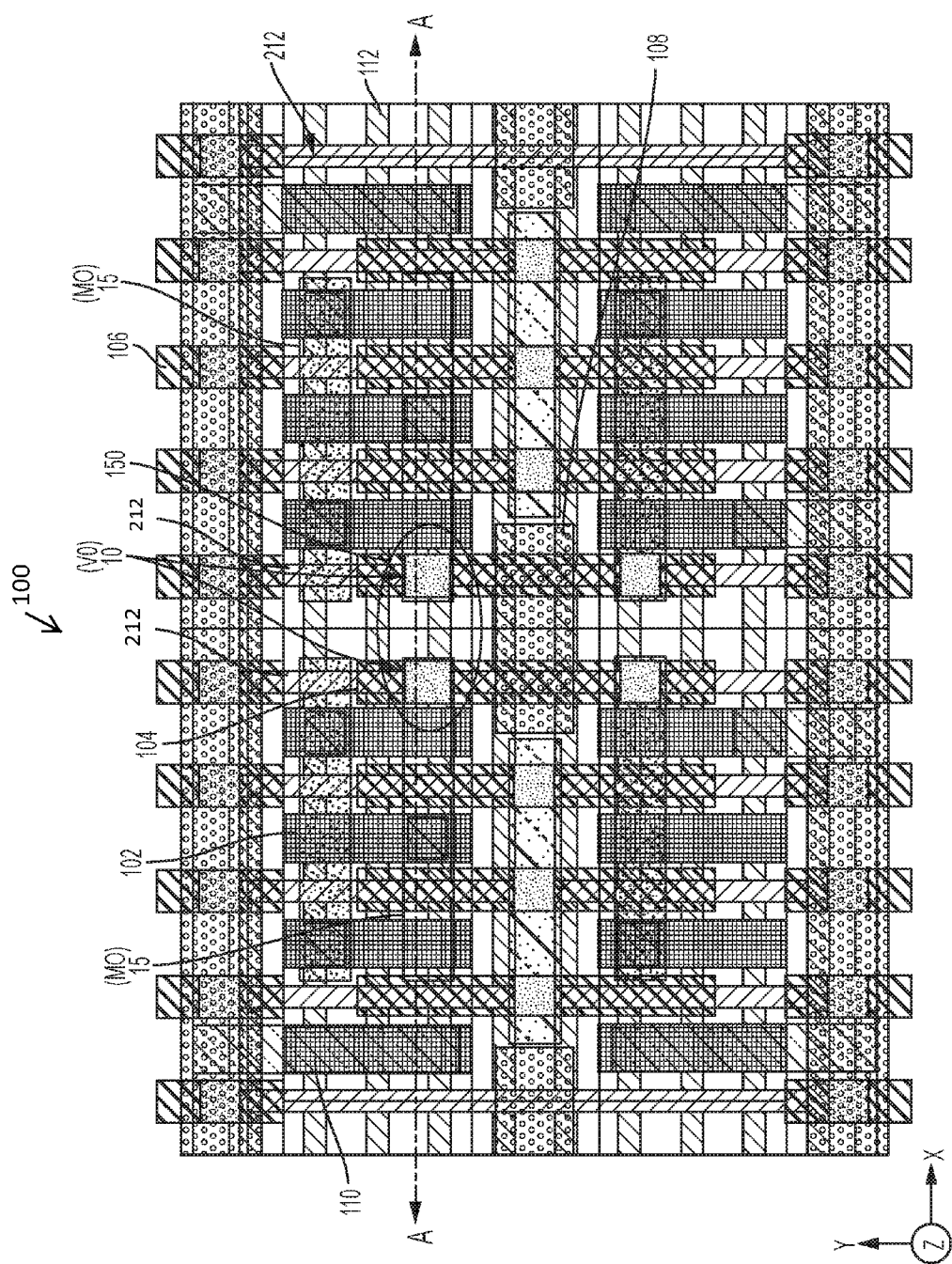
FIG. 1A is a top-down view of a schematic for an integrated circuit according to an embodiment.

FIG. 1A is a top-down view of a schematic for an integrated circuit 100 according to an embodiment. The schematic of the integrated circuits 100 depicts many layers that have been formed. Metal layer 10 is the V0 metal layer. The metal layer 10 is formed on top of the metal layer 15. The metal layer 15 is the M0 metal layer. There is a V0 metal layer 10 on each of the M0 metal layers 15, and the separation between the two M0 metal layers 15 is the M0 tip-to-tip. Circle 150 is highlighted to illustrate an enlarged view of the M0 tip-to-tip.

Figure 1B:
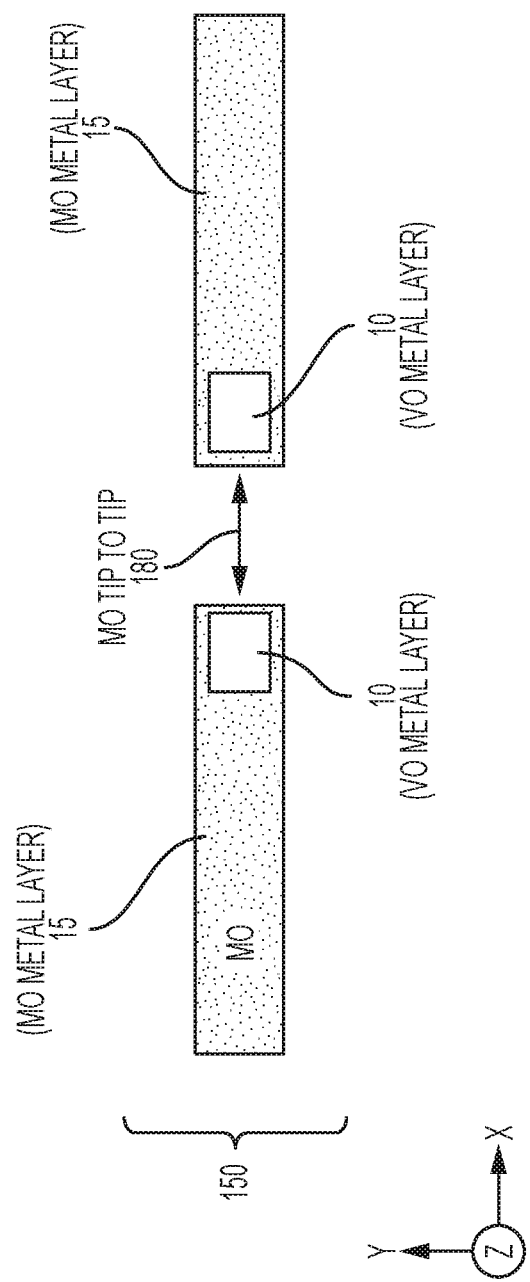
FIG. 1B depicts an enlarged view of a portion the integrated circuit in FIG. 1A according to an embodiment.

FIG. 1B illustrates the enlarged view in circle 150 of the integrated circuit 100. FIG. 1B depicts the M0 metal tip-totip 180 to show that the tip-to-tip is measured between the two M0 metal layers 15 in the x-axis. It should be appreciated that although only one M0 metal tip-to-tip is highlighted there are numerous M0 metal layers 15 with the M0 tip-to-tip.

Referring to FIG. 1A, layer 212 is the gate. FIG. 1A may include trench silicide 102 (which corresponds to 402 below), M1 metal layer 104 and 106 (which correspond to 1408 below), M0 metal layer 108, CA metal layer 110, and fin 112.

A fabrication process is discussed below in FIGS. 2-15, and the fabrication process is illustrated from a cross-sectional view cut along line A-A in FIG. 1A. The fabrication process may be utilized to build an integrated circuit, such as the integrated circuit 100, with an improved M0 metal tip-to-tip.

Figure 2:
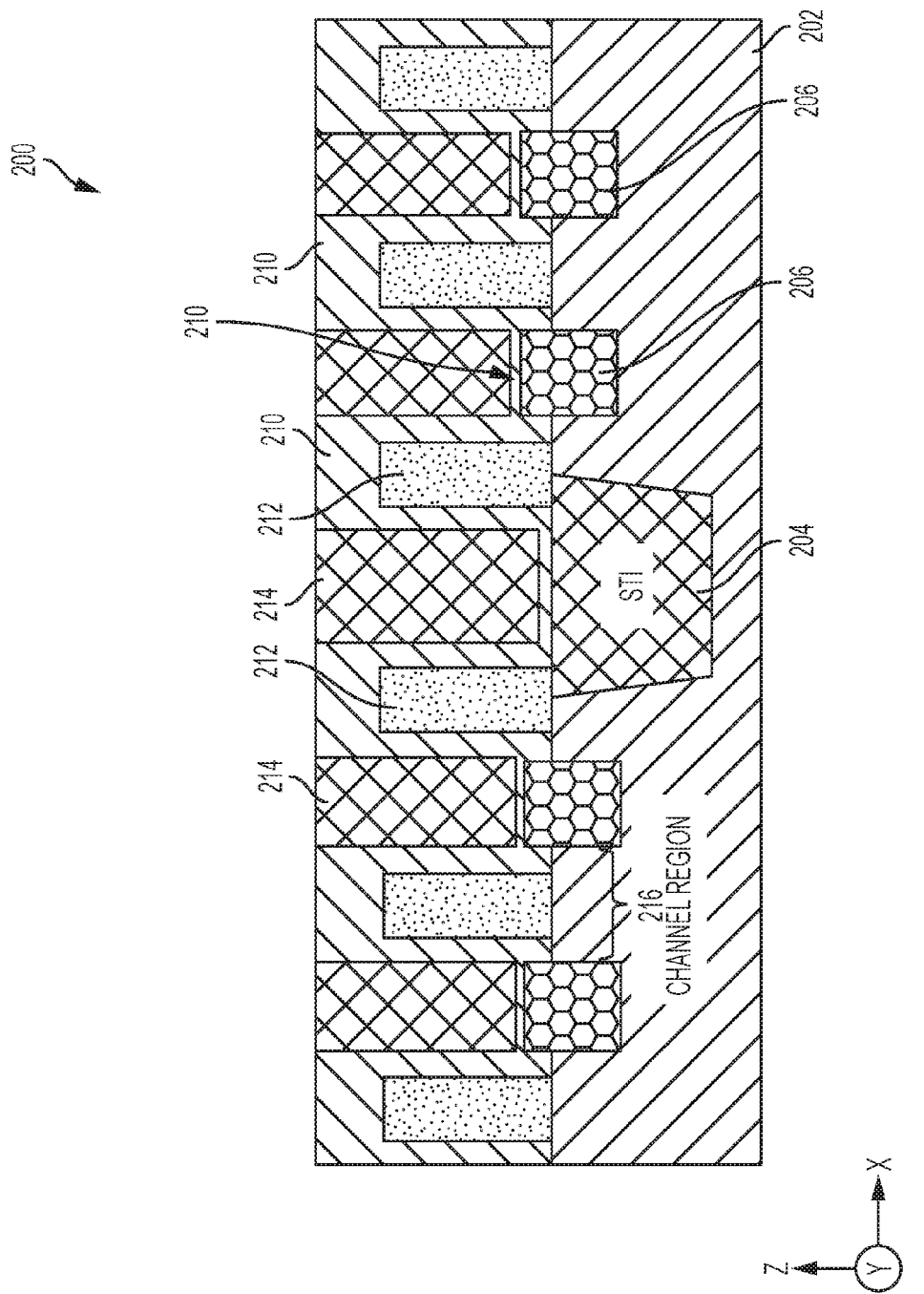
FIG. 2 is a cross-sectional view of an intermediate structure of an integrated circuit according to an embodiment.

FIG. 2 is a cross-sectional view of an intermediate structure 200 (for an integrated circuit) according to an embodiment. One or more shallow trench isolations (STI) 204 are formed in a substrate 202 using standard lithography processes. The substrate 202 may be a wafer, such as, e.g., a silicon wafer.

Source and drains 206 are formed in the substrate 202 using standard lithography processes. The sources and drains 206 may be p-type or n-type wells depending on the application, along with a corresponding epitaxy layer on top. Gates 212 are formed on the substrate 202 using standard lithography processes. The gates 212 may be high-k metal gates. The gates 212 may include a high-k material, such as, e.g., hafnium dioxide ($HfO_2$), zirconium dioxide ($ZrO_2$), and titanium dioxide ($TiO_2$), with a metal on top.

A layer 210 may be formed on top of the substrate 202, the sources/drains 206, and the gates 212. The layer 210 may be a nitride, such as silicon nitride, siliconborocarbonitride (SiBCN), etc.

Trenches may be formed in the layer 210, and layer 214 may be formed in the trenches. The layer 214 may be an oxide layer, such as, e.g., silicon dioxide. In one implementation, the layer 214 may be flowable oxide. Chemical mechanical polishing/planarization may be performed on the intermediate structure 200 to form a level surface.

Figure 3:
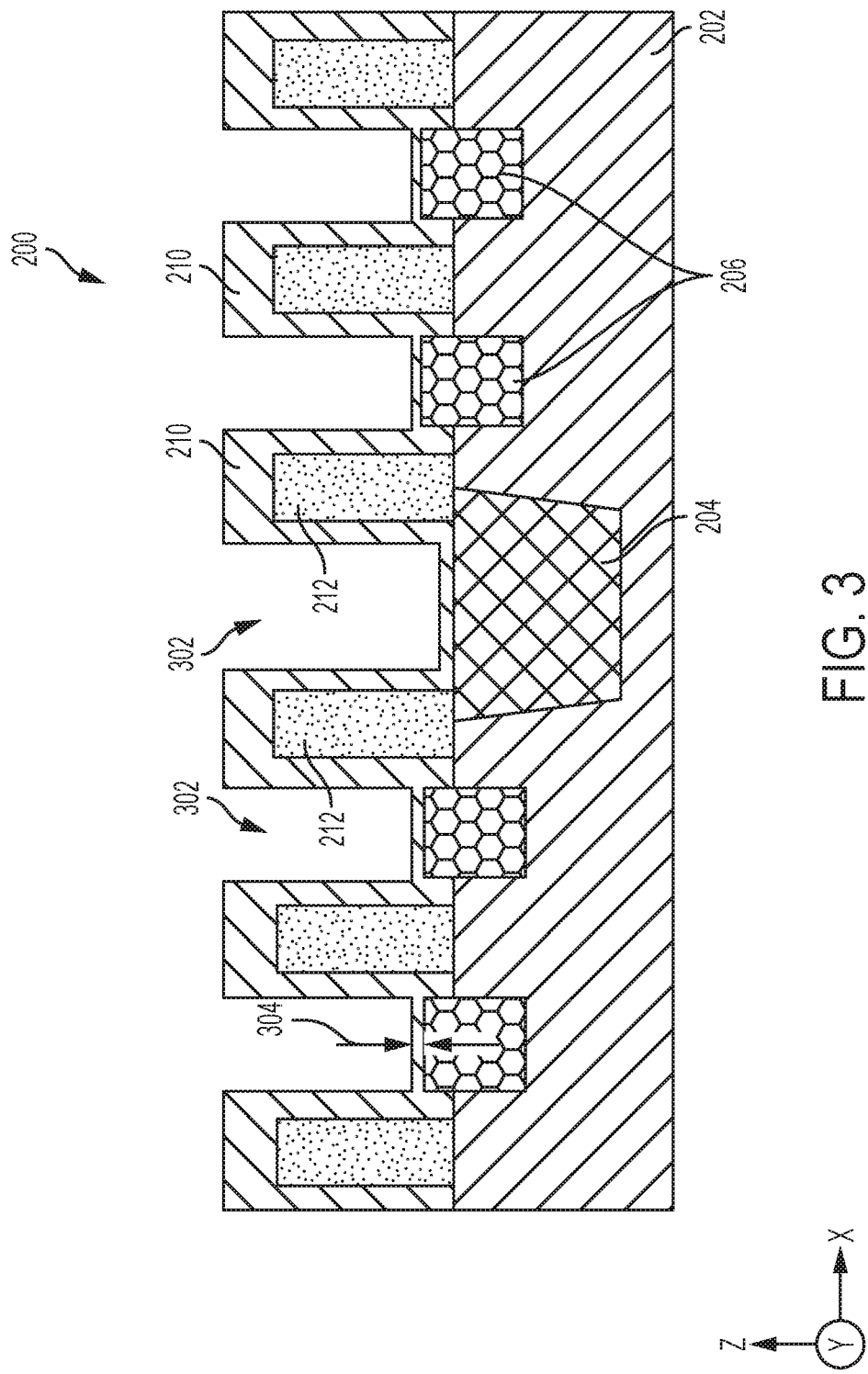
FIG. 3 is a cross-sectional view of the intermediate structure depicting rectangular shaped trench silicide (TS) patterning according to an embodiment.

FIG. 3 is a cross-sectional view of the intermediate structure 200 depicting rectangular shaped trench silicide (TS) patterning according to an embodiment. As can be seen, the oxide layer 214 in FIG. 2 has been removed from the intermediate structure 200 in FIG. 3 leaving behind trench silicide (TS) patterns/trenches 302. The oxide layer 214 may be removed by etching with an etchant designed to remove the oxide layer 214 but not the nitride layer 210. A thin layer 304 (i.e., liner) of nitride may remain over the sources/drains 206, and this thin layer 304 is further removed by a fixed time dry etch process. For example, the thin layer 304 may be about 3 nanometers (nm) thick in the z-axis.

Figure 4:
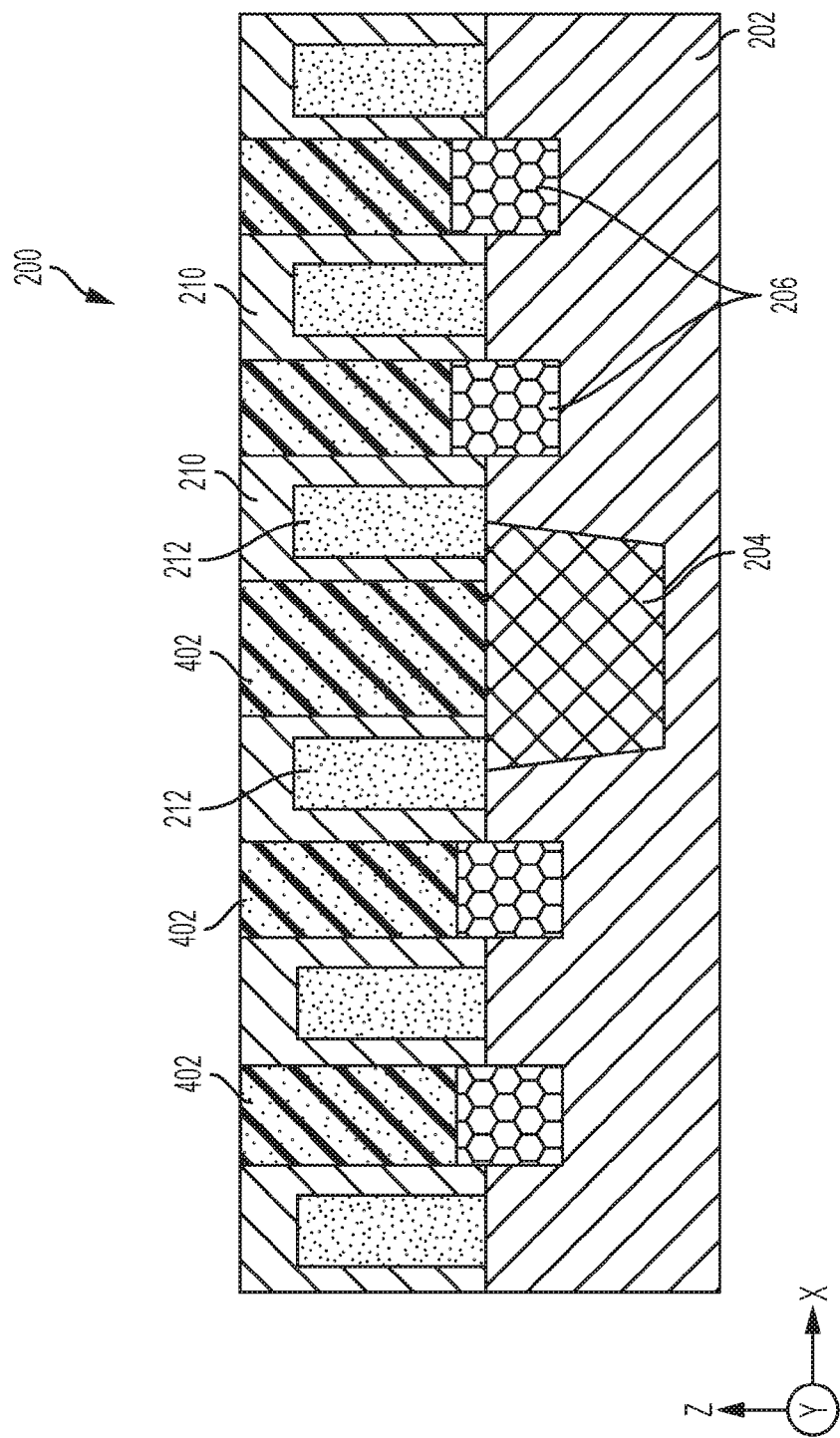
FIG. 4 is a cross-sectional view of the intermediate structure depicting trench silicide formation according to an embodiment.

FIG. 4 is a cross-sectional view of the intermediate structure 200 depicting removal of the thin layer 304, trench silicide formation, and chemical mechanical polishing/planarization processing according to an embodiment. After the thin layer 304 is removed from on top of the sources/drains 206, trench silicide contacts 402 are formed in each of the trench silicide patterns/trenches 302. A trench silicide contact 402 is formed on top of each source/drain 206, and CMP processing is performed to level and smooth the top of the intermediate structure 200.

The trench silicide contact 402 may include $WSi_2$, $TiSi_2$, $NiSi$, and $CoSi_2$. One example of forming the trench silicide contact 402 may include forming a metal on top of the source/drain 206 and then heating the intermediate structure 200 to form the trench silicide, and further filling the contact 402 with conductive metals such as W and Co and/or with liner or barrier metal liners such as TiN.

Figure 5:
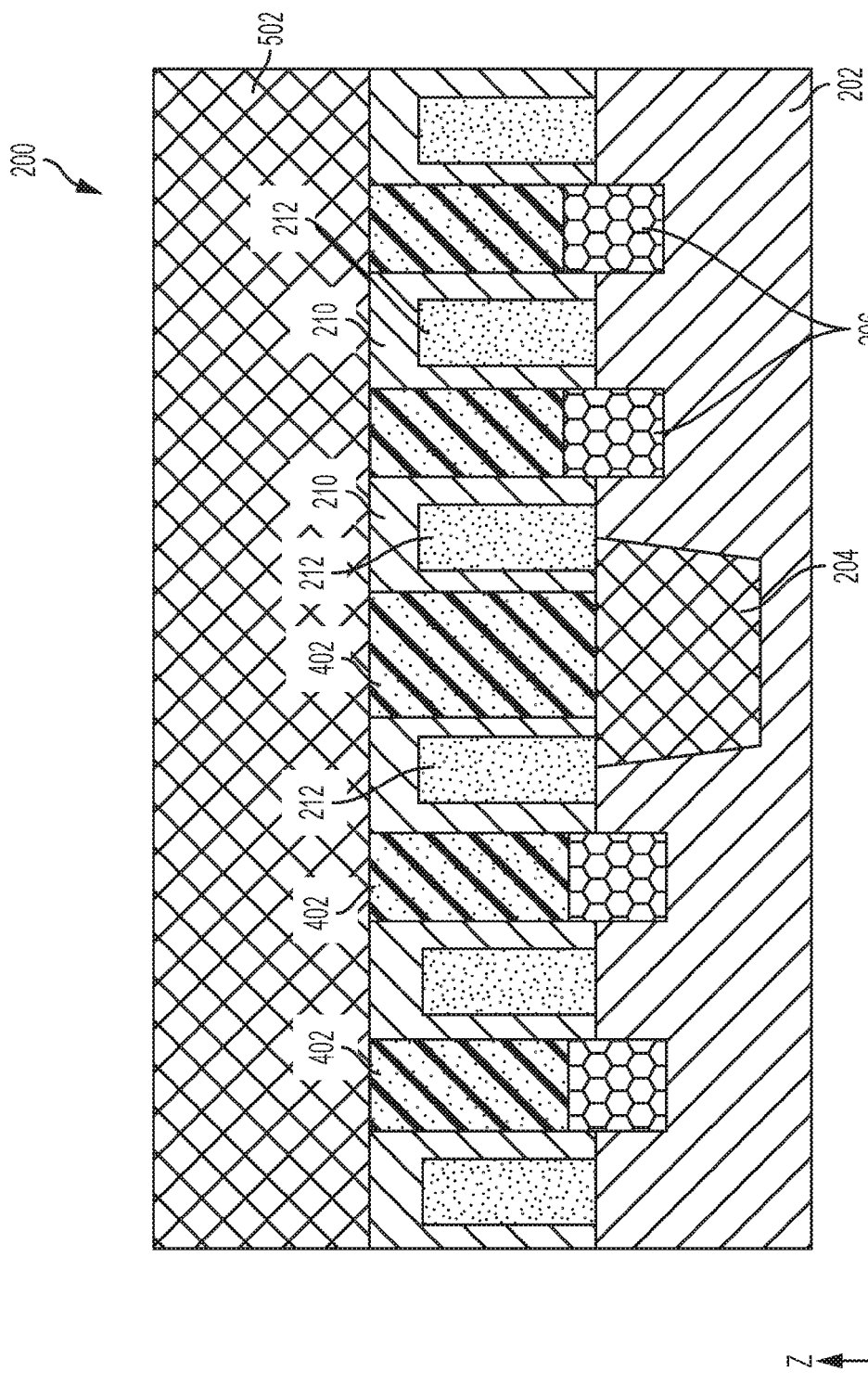
FIG. 5 is a cross-sectional view of the intermediate structure depicting deposition of an interlayer dielectric layer according to an embodiment.

FIG. 5 is a cross-sectional view of the intermediate structure 200 depicting deposition of an interlayer dielectric layer 502 according to an embodiment. The interlayer dielectric layer 502 is formed on top of the nitride layer 210 and the trench silicide contact 402 using standard lithography processes. The interlayer dielectric layer 502 may be an oxide layer. An example of the interlayer dielectric layer 502 may include PECVD oxide.

Figure 6:
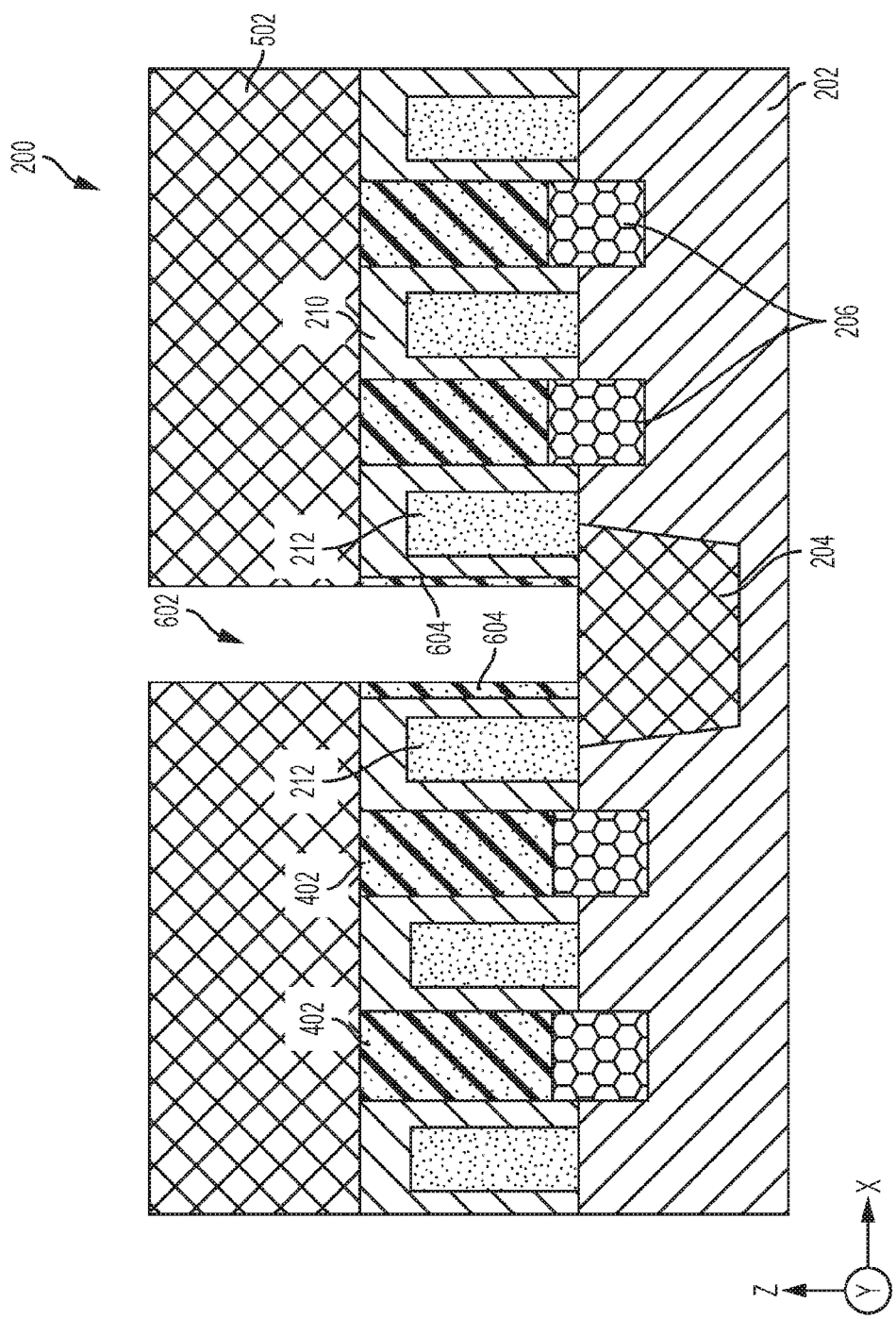
FIG. 6 is a cross-sectional view of the intermediate structure depicting late trench silicide (TS) cut patterning according to an embodiment.

FIG. 6 is a cross-sectional view of the intermediate structure 200 depicting late trench silicide (TS) cut patterning according to an embodiment. A late TS cut pattern/trench 602 is cut into the intermediate structure 200. The TS cut pattern/trench 602 is late because the late TS cut pattern/trench 602 occurs after the trench silicide (TS) patterns/trenches 302 have been etched and after the trench silicide contacts 402 have already been formed. As an example, the late TS cut pattern/trench 602 may be formed by conventional lithography and plasma dry etch process. The late TS cut pattern/trench 602 may still have a remainder portion 604 of the trench silicide contact metal 402 along the sides of the late TS pattern/trench 602. In one implementation, the cut may not leave a remainder portion 604 of the trench silicide contact 402 along the sides of the late TS pattern/trench 602.

In the state-of-the-art process flow, there is no such late TS cut process. Therefore, the M0 tip-to-tip is purely determined by the lithography process, and the M0 tip-to-tip could be bad (huge) because of misalignment (especially if the M0 metal layer is patterned in multiple colors: e.g., multiple lithography exposure and etch); in this way, if there is misalignment color to color, the M0 tip-to-tip is worsened. However, embodiments introduce the late TS cut process and produce a SiN layer on top, such that M0 tip-to-tip is self-aligned, and not dependent on lithography misalignment. It is appreciated that in VLSI layout, the layout of the layers (forming the circuit) are represented by different colors.

Figure 7:
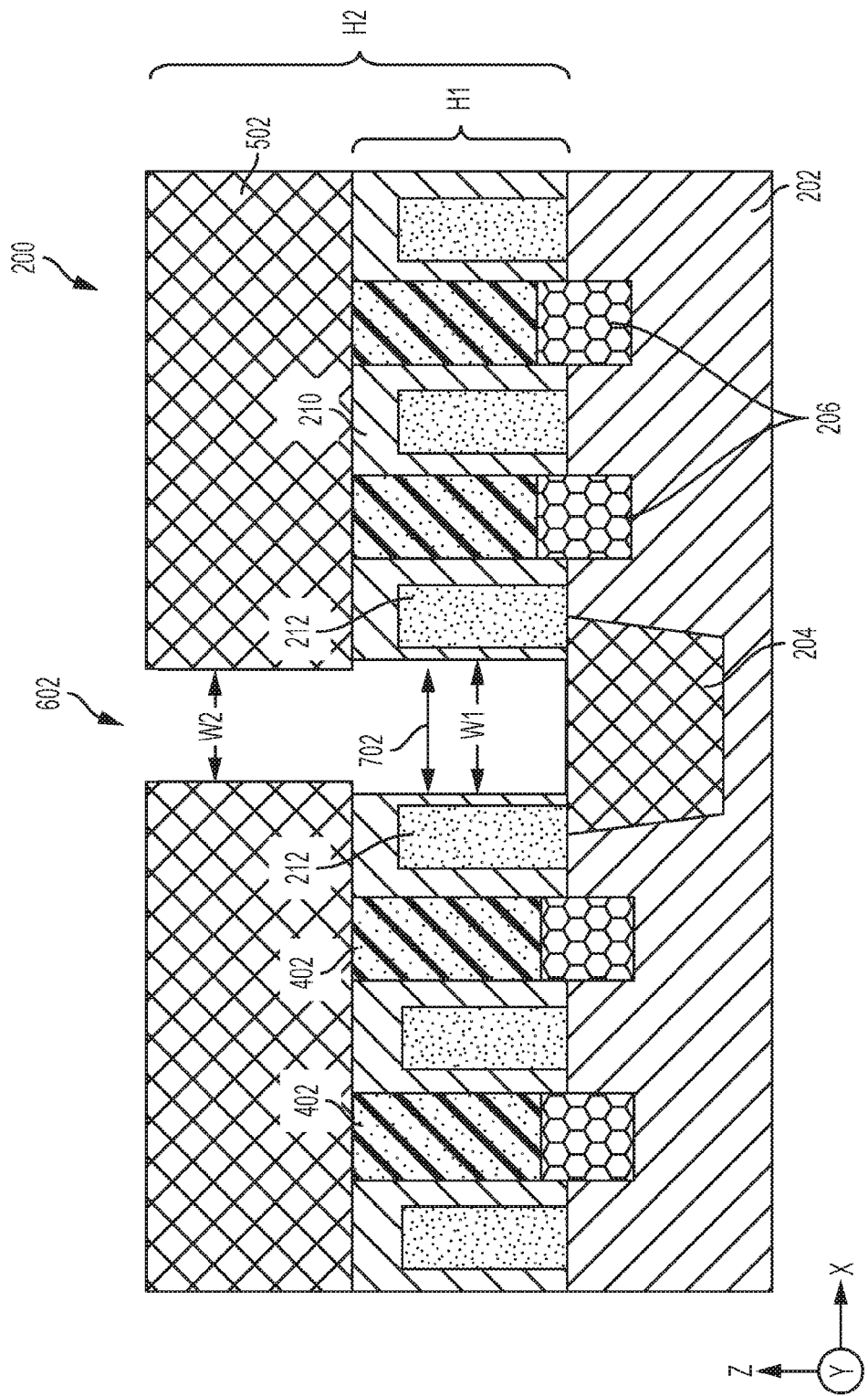
FIG. 7 is a cross-sectional view of the intermediate structure depicting the late trench silicide pattern/trench after an additional metal etch according to an embodiment.

FIG. 7 is a cross-sectional view of the intermediate structure 200 depicting the late trench silicide pattern/trench 602 after performing an additional metal etch according to an embodiment. The additional metal etch removes the remainder portion 604 of the trench silicide contact 402. To remove the metal of the remainder portion 604, an example etchant may be standard clean 1 (SC1), $H_2O_2$, $NH_4OH$, HCl, $HNO_3$. etc. After removing the remainder portion 604 in the late TS pattern/trench 602, the bottom of the late TS pattern/trench 602 has a wider portion 702. The wider portion 702 reaches from about half of the late TS pattern/trench 602 down to the shallow trench isolation 204. The wider portion 702 may have a height H1 in the z-axis. The late TS pattern/trench 602 may have a height H2 in the z-axis. The height H1 may range from about 50-100 nm. The height H2 may range from about 80-180 nm. The width W1 of the wider portion 702 of TS pattern/trench 602 may range from about 10-30 nm. The width W2 of the upper portion of the TS pattern/trench 602 may range from about 10-40 nm.

Figure 8:
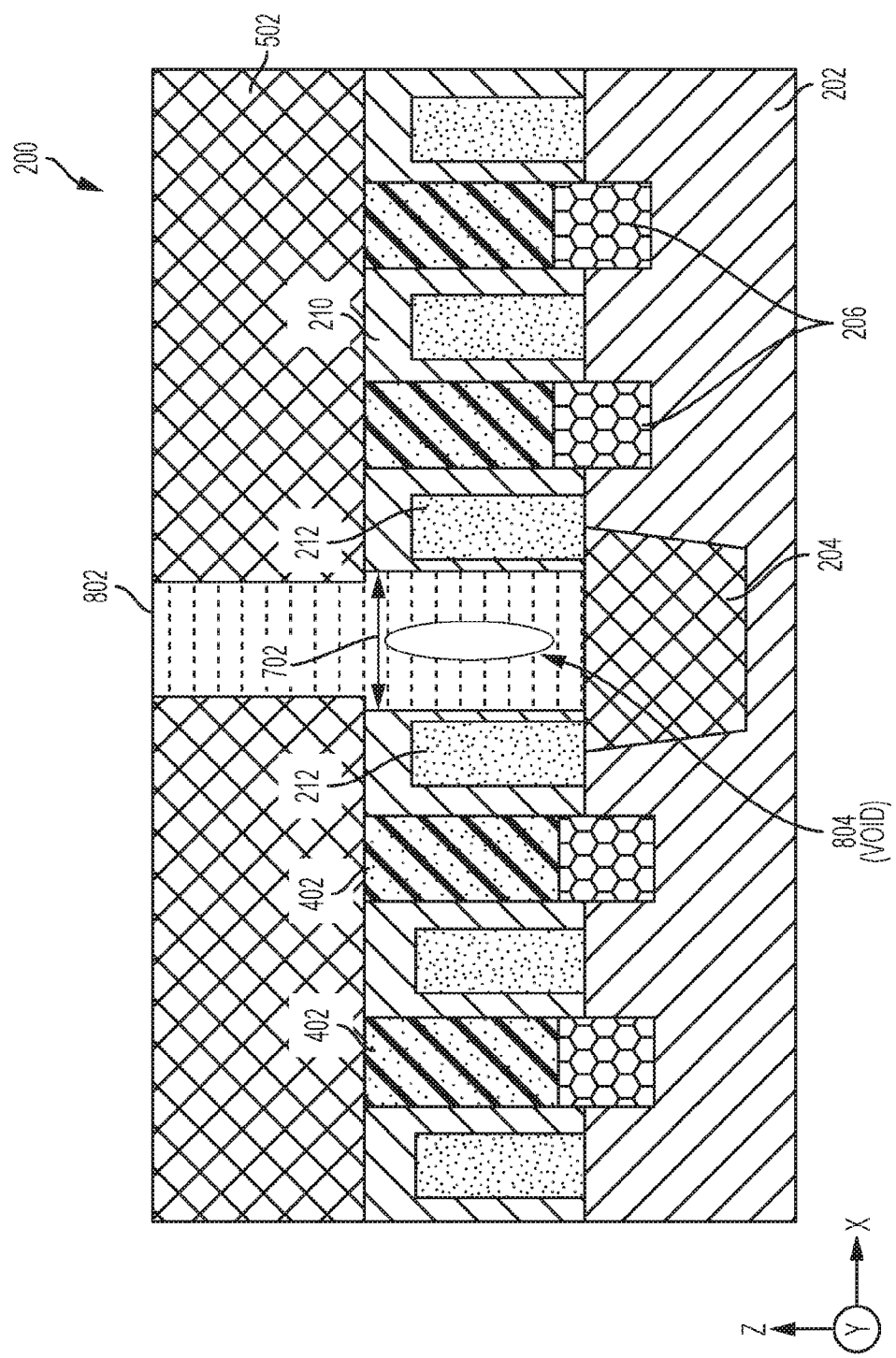
FIG. 8 is a cross-sectional view of the intermediate structure depicting filling in the late trench silicide pattern/trench according to an embodiment.

FIG. 8 is a cross-sectional view of the intermediate structure 200 depicting filling in the late trench silicide pattern/trench 602 according to an embodiment. A fill layer 802 may be deposited and formed in the late cut trench silicide pattern/trench 602 and on top of the intermediate structure 200. Chemical mechanical polishing/planarization is performed to level the top surface of the intermediate structure 200.

In one implementation, a void 804 may be formed in the wider portion 702, and the void may be formed as a result of a conformal nitride deposition process. In another implementation, the void 804 may not be formed and the wider portion 702 is completely filled. The fill layer 802 may be a nitride, such as, e.g., silicon nitride. Other example materials of the fill layer 802 may include SiBCN, silicon oxycarbonitride (SiOCN).

Figure 9:
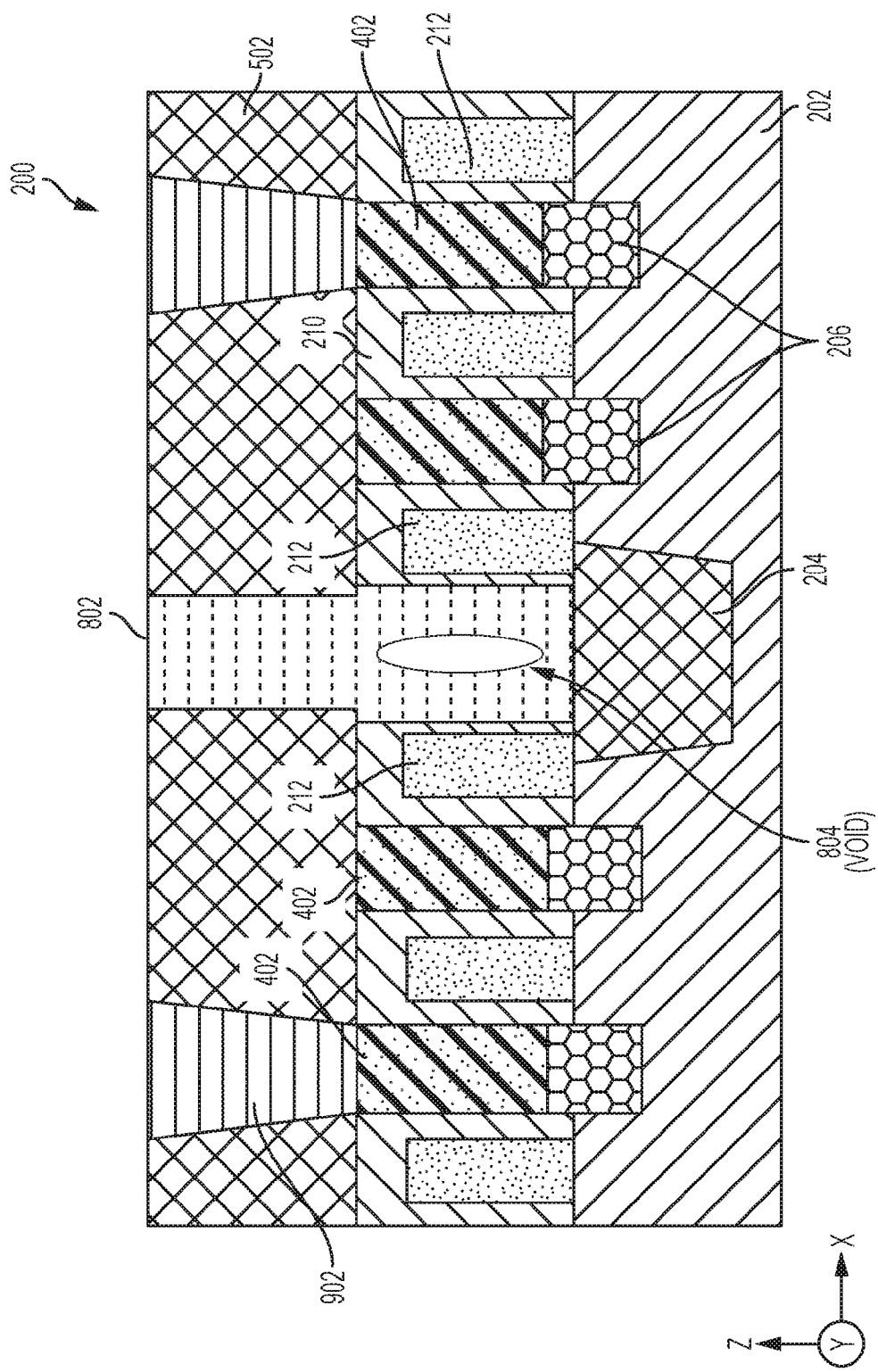
FIG. 9 is a cross-sectional view of the intermediate structure depicting upper contact patterning and filling in the upper contact pattern according to an embodiment.

FIG. 9 is a cross-sectional view of the intermediate structure 200 depicting upper contact patterning (CA) and filling in the upper contact pattern according to an embodiment. The upper contact pattern is etched over and down to the trench silicide contact 402. The upper contact pattern may be filled with a metal, such as, e.g., tungsten or cobalt, to form upper contacts 902 on top of the trench silicide contact 402. Any excess metal material may be removed by chemical mechanical polishing/planarization. In this cross-sectional view, two upper contacts 902 are shown respectively on top of trench silicide contacts 402. It should be appreciated that other trench silicide contacts 402 have their respective upper contacts 902 which are not shown in this cross-sectional view.

Figure 10:
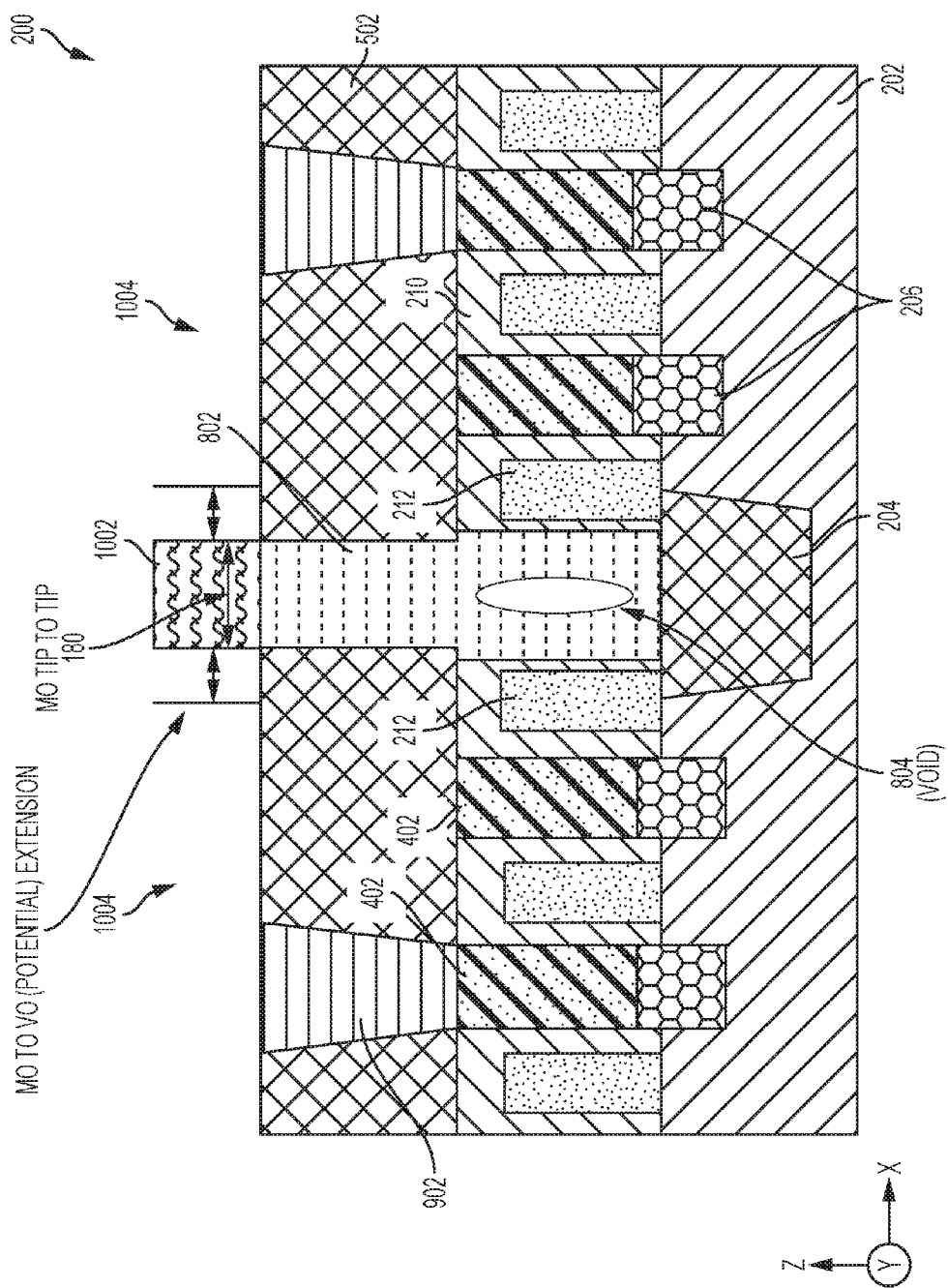
FIG. 10 is a cross-sectional view of the intermediate structure depicting preparation for metal patterning according to an embodiment.

FIG. 10 is a cross-sectional view of the intermediate structure 200 depicting preparation for M0 metal patterning according to an embodiment. For example, organic planarizing layer (OPL) 1002 is formed on top of the fill layer 802. This process is achieved by conventional lithography processes. Also, material 1002 may be some other hardmask material (e.g., TiN), which is formed by litho patterning and pattern transfer, especially when multiple litho/etch processes are used. In one implementation, the organic planarizing layer may be deposited on the top surface of the intermediate structure 200, and the organic planarizing layer is etched into the shape of the organic planarizing layer 1002. Etching to form the portion of organic planarizing layer 1002 correspondingly prepares space 1004 (in preparation for the M0 metal pattern) on both sides of the organic planarizing layer 1002.

FIG. 10 shows a potential M0 to V0 extension but since V0 metal layer has not been printed yet for this is not the actual M0 to V0 extension in this figure. For a top down design layout, the V0 metal layer lands on M0 metal layer. However, usually one further extends the M0 metal layer for some distance over the V0 metal layer, such that at worse case litho misalignment, V0 still lands on M0. The distance is called M0 to V0 extension.

Also, FIG. 10 shows that the width of the organic planarizing layer 1002 in the x-axis corresponds to the width of the M0 tip-to-tip 180. FIG. 10 shows a case in which the patterning process of the layer 1002 is (perfectly) aligned to and fully covers/protects the width of the fill layer 802.

Figure 11:
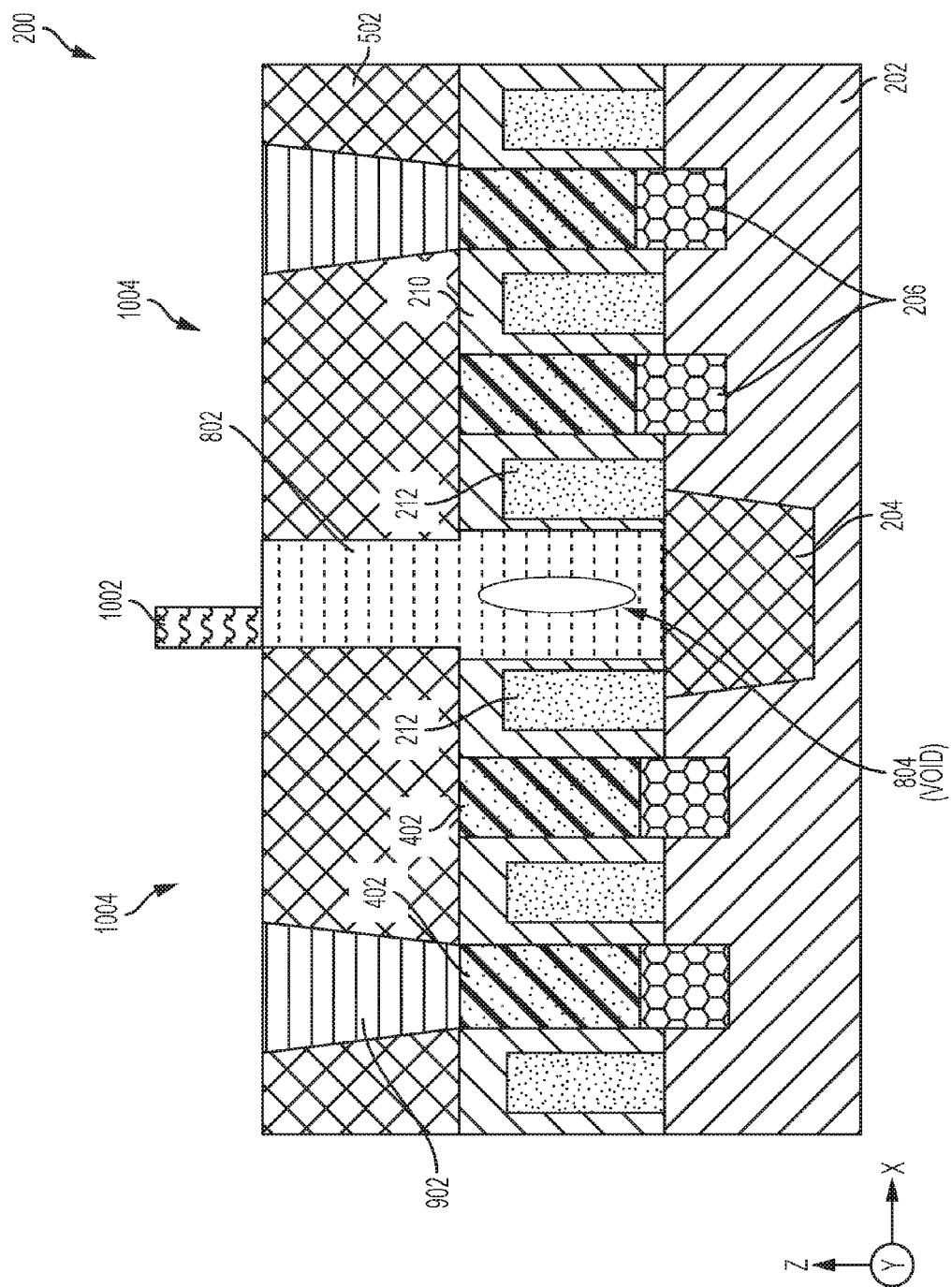
FIG. 11 is a cross-sectional view of the intermediate structure depicting another example of preparation for metal patterning according to an embodiment.

In another example, FIG. 11 is a cross-sectional view of the intermediate structure 200 depicting M0 metal patterning in which the layer 1002 does not fully cover the width of the fill layer 802 according to an embodiment. This refers to the case where the M0 litho process has tip-to-tip critical dimension (CD) variation or enlargement, and/or there is huge litho misalignment during multiple color litho/etch process. The case in FIG. 11 shows that the space 1004 in preparation for the M0 metal pattern can be formed and utilized even when the organic planarizing layer 1002 does not fully cover the width of the fill layer 802. FIG. 10 may represent a case with better organic planarizing layer 1002 alignment as compared to the case in FIG. 11.

Figure 12:
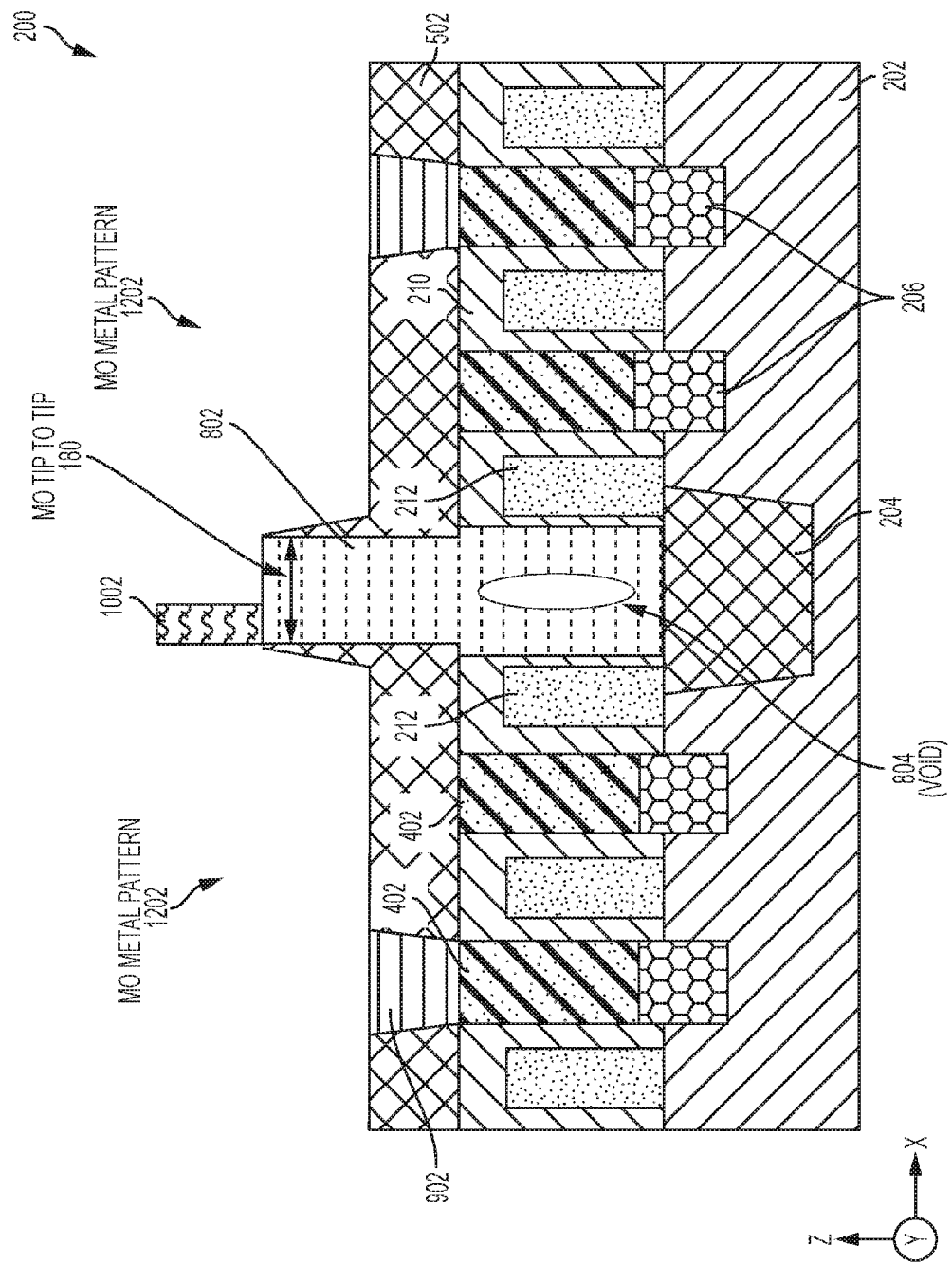
FIG. 12 is a cross-sectional view of the intermediate structure selective etching to form a metal pattern according to an embodiment.

FIG. 12 is a cross-sectional view of the intermediate structure 200 depicting selective etching to form M0 metal pattern 1202 according to an embodiment. The interlayer dielectric layer 502 and the upper contacts 902 are etched to form the M0 metal pattern 1202. FIG. 12 depicts the organic planarizing layer 1002 with the smaller width (from FIG. 11) to show that the M0 metal pattern 1202 can still be aligned even though the organic planarizing layer 1002 does not fully cover the fill layer 802 but it should be appreciated that the organic planarizing layer 1002 having the full width in FIG. 10 may be utilized as well. It should be appreciated that the width of the M0 tip-to-tip 180 is maintained even under the condition when organic planarizing layer 1002 is less than the width of the M0 tip-to-tip 180. Etching the interlayer dielectric layer 502 (e.g., oxide) and the upper contacts 902 (e.g., cobalt, tungsten, etc.) to form the M0 metal pattern 1202 does not remove the fill layer 802 (e.g., nitride) and the organic planarizing layer 1002. In one implementation, a thin sidewall of the interlayer dielectric layer 502 may remain on the fill layer 802 at the M0 metal pattern 1202. In another implementation, there may be no thin sidewall of interlayer dielectric layer 502 that remains on the fill layer 802 at the M0 metal pattern 1202.

It should be appreciated that even though examples of using the layer 1002 are discussed in FIGS. 10, 11, and 12, embodiments are still able to form well-aligned M0 tip-to-tip without layer 1002 in one implementation.

Figure 13:
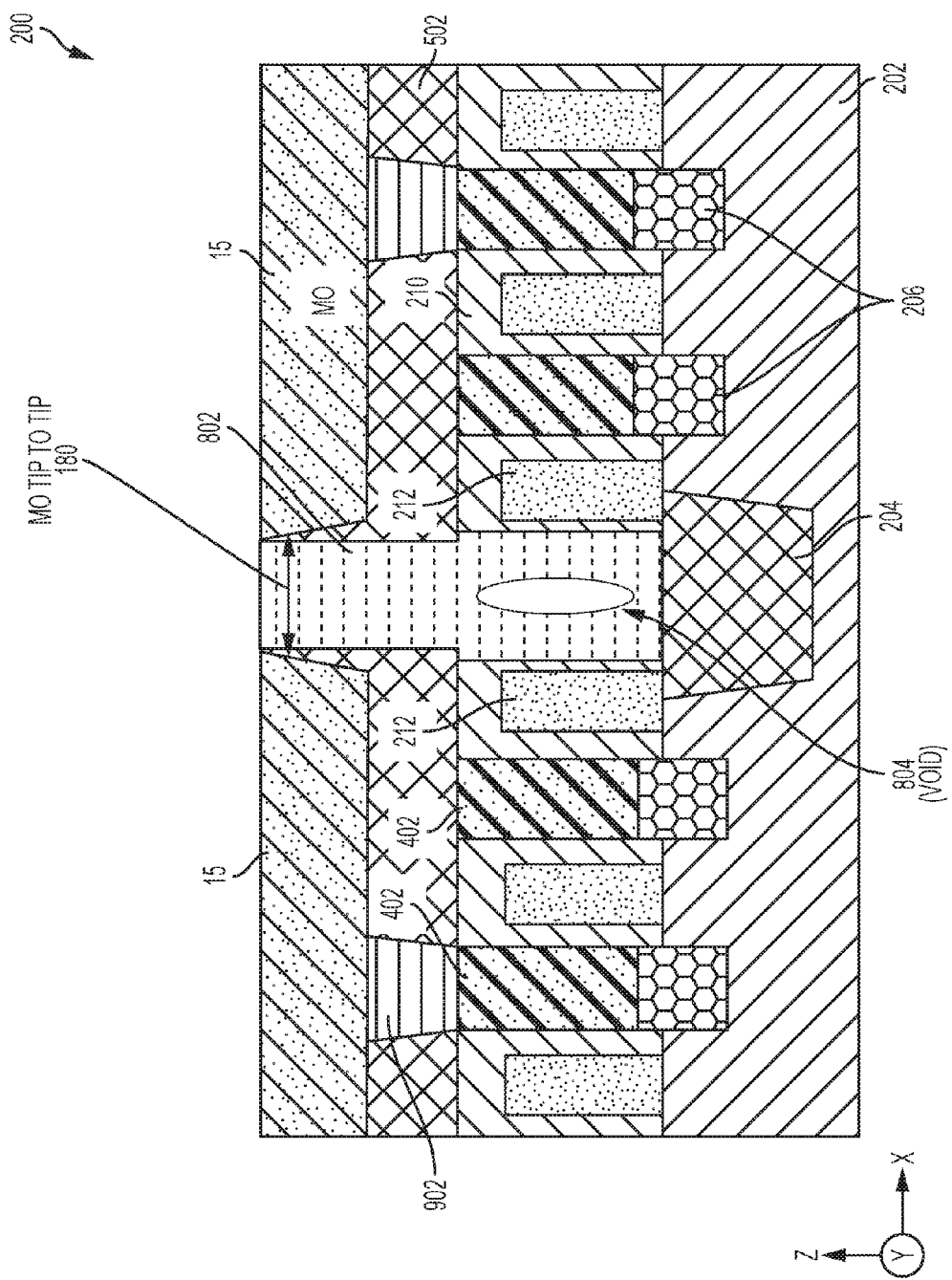
FIG. 13 is a cross-sectional view of the intermediate structure depicting metallization according to an embodiment.

FIG. 13 is a cross-sectional view of the intermediate structure 200 depicting metallization of the M0 metal layer according to an embodiment. It can be seen that M0 metal layer 15 is deposited to fill the M0 metal pattern 1202 (in FIG. 12) and chemical mechanical polishing/planarization is performed to level the top surface of the intermediate structure. The M0 metal layers 15 are spaced apart from one another in the x-axis by the fill layer 802. Accordingly, the width of the M0 tip-to-tip 180 is maintained between the M0 metal layers 15. Moreover, the region of the M0 tip-to-tip 180 shows that the tip of M0 metal layer 15 is self-aligned to the tip of the other M0 metal layer 15 by being respectively formed in the M0 metal patterns 1202 (in FIG. 12). Also, the tips of both M0 metal layers 15 are self-aligned to the filler layer 802.

In one implementation, the width of the M0 metal tip-to-tip 180 (from the edge of one M0 metal layer 15 to the other M0 metal layer 15) may range from about 20-30 nm. The metal of the M0 metal layer 15 may be copper, cobalt, etc.

Figure 14:
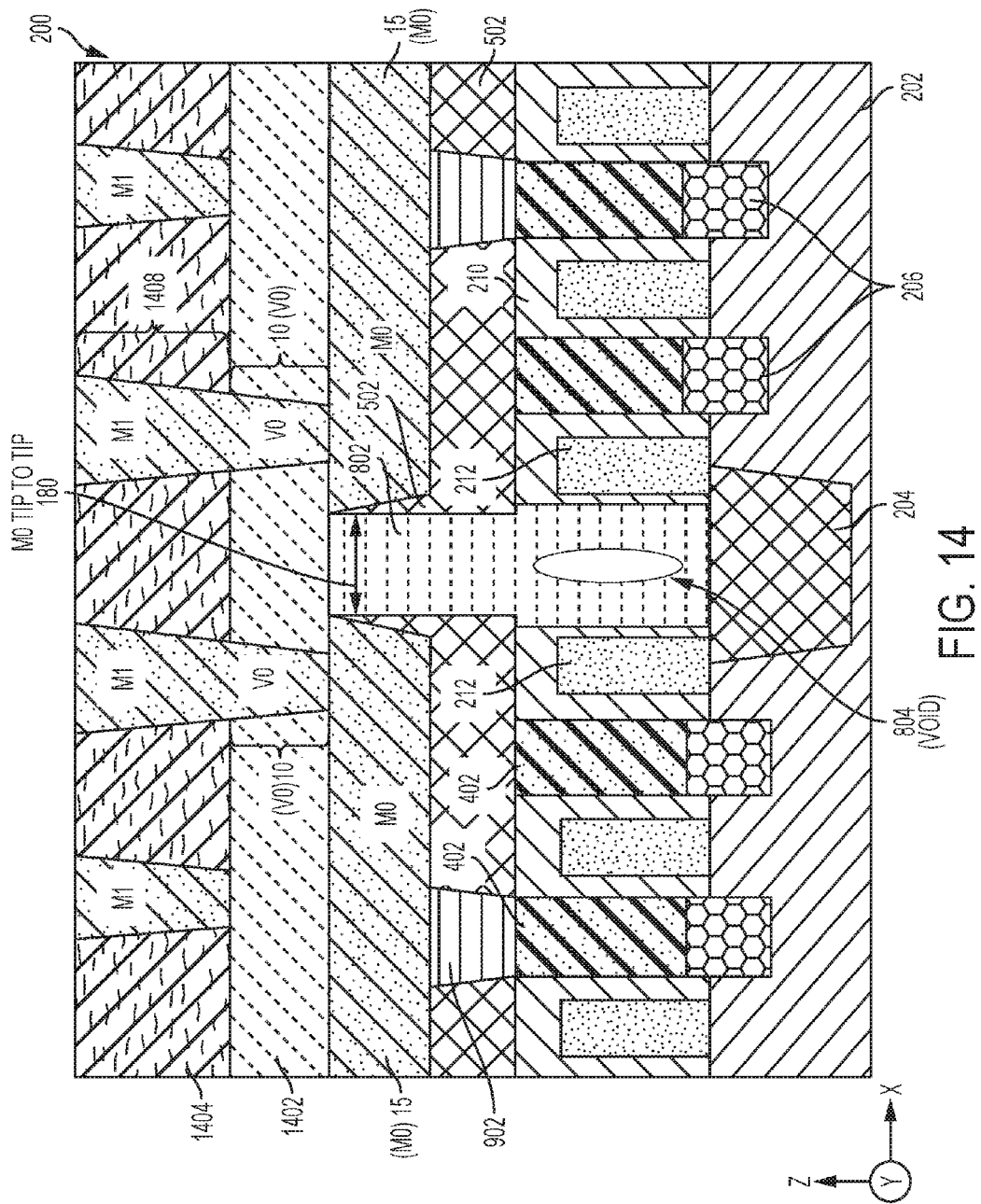
FIG. 14 is a cross-sectional view of a final structure according to an embodiment.

FIG. 14 is a cross-sectional view of a final structure 1400 (i.e., integrated circuit) depicting metallization of the V0 metal layer and the M1 metal layer according to an embodiment. The V0 metal layer 10 and the M1 metal layer 1408 may be copper, cobalt, etc. The V0 metal layer 10 may be formed through layer 1402 to connect to the M0 metal layer 15 underneath. The top of the V0 metal layer 10 connects to the bottom of the M1 metal layer 1408. The M1 metal layer 1408 is formed through layer 1404. The layer 1402 may be a nitride and the layer 1404 may be a low-k dielectric material.

The V0 metal layer 15 and the M1 metal layer 1408, along with layers 1402 and 1404, may be formed using standard lithography processes.

Figure 15:
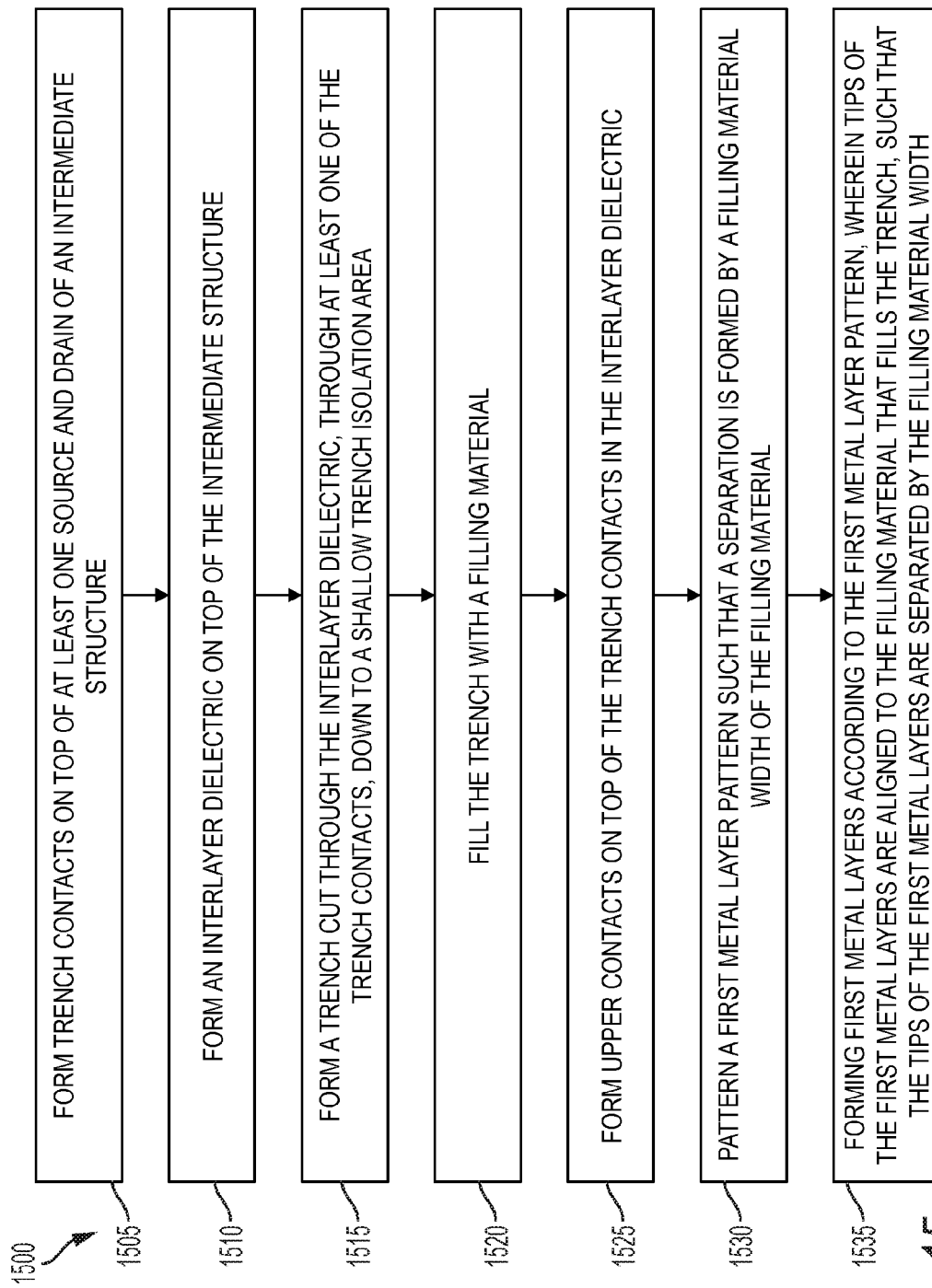
FIG. 15 is a flow chart of a method of forming an integrated circuit according to an embodiment.

FIG. 15 is a flow chart 1500 of a method of forming an integrated circuit (such as integrated circuit 100) according to an embodiment. Reference can be made to FIGS. 1-15.

At block 1505, trench contacts 402 are formed on top of at least one source and drain 206 of an intermediate structure 200. An example is illustrated in FIG. 4.

At block 1510, an interlayer dielectric 502 is formed on top of the intermediate structure 200. An example is illustrated in FIG. 5.

At block 1515, a trench 602 is cut through the interlayer dielectric 502, through at least one of the trench contacts 402, down to a shallow trench isolation area 204. An example is illustrated in FIG. 6.

At block 1520, the trench 602 is filled with a filling material 802. An example is illustrated in FIGS. 8 and 9.

At block 1525, upper contacts 902 are formed on top of the trench contacts 402 in the interlayer dielectric 502. An example is illustrated in FIG. 9.

At block 1530, a first metal layer pattern 1202 is patterned such that a separation (distance) is formed by a filling material width (e.g., width W2) of the filling material 802. An example is illustrated in FIG. 12.

At block 1535, first metal layers 15 are formed according to the first metal layer pattern 1202, wherein tips of the first metal layers 15 are aligned to the filling material 802 that fills the trench, such that the tips of the first metal layers 15 are separated by the filling material width. An example is illustrated in FIG. 13.

Second metal layers 10 are respectively formed on top of the first metal layers 15. The second metal layers 10 are on opposite sides of the filling material 802. The second metal layers 10 are separated from one another by at least the filling material width. Third metal layers 1408 are formed on top of the second metal layers 10. An example is illustrated in FIG. 14.

The source and drain 206 are formed in a substrate 202. The shallow trench isolation area 204 is formed in the substrate 202. The trench contacts 402 are formed in a nitride layer 210 that is on top of the substrate 202. One or more gates 212 are formed in the nitride layer 210 such that the one or more gates 212 separate the at least one source and drain 206. The one or more gates 212 include a high-k material.

The trench contacts 402 include a silicide because of formation on top of the at least one source and drain 206. The filling material includes nitride. The filling material width ranges from about 20-30 nanometers.

Technical effects and benefits include improved integrated circuits on a wafer. The improved integrated circuit improves a computer processor.

It will be noted that various microelectronic device fabrication methods may be utilized to fabricate the components/elements discussed herein as understood by one skilled in the art. In semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming an integrated circuit, the method comprising:
    forming trench contacts on top of a shallow trench isolation area, sources and drains of an intermediate structure;
    forming an interlayer dielectric on top of the intermediate structure;
    forming a trench cut through the interlayer dielectric, through the trench contacts on top of the shallow trench isolation area, wherein the trench has a wider portion in the shallow trench isolation area than in the interlayer dielectric;
    filling the trench with a filling material having a void in the wider portion;
    forming upper contacts on top of the trench contacts in the interlayer dielectric;
    patterning a first metal layer pattern such that a separation is formed by a filling material width of the filling material; and
    forming first metal layers according to the first metal layer pattern, wherein tips of the first metal layers are aligned to the filling material that fills the trench, such that the tips of the first metal layers are separated by the filling material width.

2. The method of claim 1, wherein second metal layers are respectively formed on top of the first metal layers.

3. The method of claim 2, wherein the second metal layers are on opposite sides of the filling material.

4. The method of claim 3, wherein the second metal layers are separated from one another by more than the filling material width.

5. The method of claim 4, wherein third metal layers are formed on top of the second metal layers.

6. The method of claim 1, wherein the sources and drains are formed in a substrate.

7. The method of claim 6, wherein the shallow trench isolation area is formed in the substrate.

8. The method of claim 6, wherein the trench contacts are formed in a nitride layer that is on top of the substrate.

9. The method of claim 8, wherein one or more gates are formed in the nitride layer such that the one or more gates separate the sources and drains.

10. The method of claim 9, wherein the one or more gates include a high-k material.

11. The method of claim 1, wherein the trench contacts include a silicide because of formation on top of the sources and drains.

12. The method of claim 1, wherein the filling material include nitride.

13. The method of claim 1, wherein the filling material width ranges from 20-30 nanometers.

\* \* \* \* \*